United States Patent
Phillips et al.

(10) Patent No.: US 10,423,744 B1
(45) Date of Patent: Sep. 24, 2019

(54) REDUCED RESOURCE HARMONIC BALANCE CIRCUIT SIMULATIONS

(71) Applicant: Cadence Design Systems, Inc., San Jose, CA (US)

(72) Inventors: Joel Reuben Phillips, Oakland, CA (US); Jun Meng, Beijing (CN); Yunbo Pang, Beijing (CN)

(73) Assignee: Cadence Design Systems, Inc., San Jose, CA (US)

( * ) Notice: Subject to any disclaimer, the term of this patent is extended or adjusted under 35 U.S.C. 154(b) by 864 days.

(21) Appl. No.: 14/607,914

(22) Filed: Jan. 28, 2015

(51) Int. Cl.
*G06F 17/50* (2006.01)

(52) U.S. Cl.
CPC ...... *G06F 17/5036* (2013.01); *G06F 17/5009* (2013.01); *G06F 17/5045* (2013.01)

(58) Field of Classification Search
None
See application file for complete search history.

(56) References Cited

U.S. PATENT DOCUMENTS

| | | | | |
|---|---|---|---|---|
| 5,467,291 | A * | 11/1995 | Fan | G06F 17/5036 703/14 |
| 5,588,142 | A * | 12/1996 | Sharrit | G06F 17/5036 703/14 |
| 5,610,847 | A * | 3/1997 | Kundert | G01R 23/16 324/608 |
| 5,666,367 | A * | 9/1997 | Troyanovsky | G06F 17/5036 714/724 |
| 5,808,915 | A * | 9/1998 | Troyanovsky | G06F 17/5036 703/14 |
| 5,867,416 | A * | 2/1999 | Feldmann | G06F 17/16 708/801 |
| 5,995,733 | A * | 11/1999 | Roychowdhury | G06F 17/5036 716/113 |
| 6,151,698 | A * | 11/2000 | Telichevesky | G06F 17/5036 703/13 |
| 6,154,716 | A * | 11/2000 | Lee | G06F 17/5036 703/14 |
| 6,167,359 | A * | 12/2000 | Demir | G01R 29/26 375/226 |
| 6,182,270 | B1 * | 1/2001 | Feldmann | G06F 17/12 703/14 |

(Continued)

OTHER PUBLICATIONS

Applying Harmonic Balance to Almost-Periodic Circuits by Kenneth s. Kundert et al, IEEE Transactions on Microwave Theory and Techniques, vol. 36, No. 2, February 1988; pp. 366-378.*

(Continued)

*Primary Examiner* — Aniss Chad
(74) *Attorney, Agent, or Firm* — Vista IP Law Group, LLP

(57) ABSTRACT

A system, method, and computer program product for reduced resource harmonic balance circuit simulations is disclosed, wherein a lattice structure is implemented in place of conventional approaches in order to reduce the amount of data being processed in each iteration of the harmonic balance process. Additionally, sparse frequency cuts, which correspond to the lattice structures, are disclosed. The sparse frequency cuts and the lattice structure may be may be customized, modified, and/or adjusted to match a variety of circuits with non-linear components, such as those found in microwave, RF, and multicarrier (e.g. LTE) implementations.

20 Claims, 17 Drawing Sheets

(56) References Cited

U.S. PATENT DOCUMENTS

| | | | | |
|---|---|---|---|---|
| 7,428,477 | B1* | 9/2008 | Phillips | G06F 17/5036 703/14 |
| 7,493,240 | B1* | 2/2009 | Feng | G06F 17/5036 703/14 |
| 7,574,342 | B2* | 8/2009 | Kundert | G06F 17/5036 703/13 |
| 8,131,521 | B1* | 3/2012 | Karanko | G06F 17/5036 703/17 |
| 8,180,621 | B2* | 5/2012 | Phillips | G06F 17/5031 703/14 |
| 8,326,591 | B1* | 12/2012 | Cai | G06F 17/5036 703/13 |
| 8,473,533 | B1* | 6/2013 | Mehrotra | G06F 17/16 708/200 |
| 8,666,689 | B1* | 3/2014 | Lai | G06F 17/5036 331/44 |
| 8,949,099 | B1* | 2/2015 | Lai | G06F 17/5036 702/70 |
| 9,449,129 | B2* | 9/2016 | Gullapalli | G06F 17/5022 |
| 9,507,894 | B1* | 11/2016 | Lai | G06F 17/5022 |
| 2003/0172358 | A1* | 9/2003 | Alon | G06F 17/5036 716/102 |
| 2004/0083437 | A1* | 4/2004 | Gullapalli | G06F 17/5036 716/115 |
| 2009/0153132 | A1* | 6/2009 | Tufillaro | H03F 1/3241 324/76.21 |
| 2009/0228250 | A1* | 9/2009 | Phillips | G06F 17/5031 703/2 |
| 2009/0276195 | A1* | 11/2009 | Bouaricha | G06F 17/5036 703/2 |

OTHER PUBLICATIONS

Multi-Core Accelerated Harmonic Balance Method for Multi-Tone Full Chip RFIC Simulation by Jun Meng et al IEEE 2011. 4 Pages.*

Efficient computation of quasi-periodic circuit operating conditions via a mixed frequency/time approachby Dan Feng et a; ACM 1999, pp. 635-640.*

Harmonic Balance, Agilent Presentation, 2009, 26 Slides.*

Lutz Kammerer. Reconstructing hyperbolic cross trigonometric polynomials by sampling along generated sets. https://www.-user.tu-chemnitz.de/~lkae/paper/Ka2012.pdf, 2000.

L. Kammerer, S. Kunis, and D. Potts. Interpolation Lattices for Hyperbolic Cross Trigonometric Polynomials. Preprint 53, DFG-SPP 1324, Jul. 2010.

L. Kammerer and S. Kunis. One the Stability of the Hyperbolic Cross Discrete Fourier Transform. Preprint 34, DFG-SPP 1324, Dec. 2009.

S.El-Rabaie, V.F.Fusco and C. Stewart. Harmonic balance evaluation of nonlinear microwave circuits—a tutorial approach. IEEE Transactions on Education. vol. 31, Issue: 3, pp. 181-192, 1988.

J.H.Haywood and Y.L. Chow. Intermodulation distortion analysis using a frequency-domain harmonic balance technique. vol. 36, Issue: 8, p. 1251-1257, 1988.

Wei Dong and Peng Li. Hierarchical Harmonic-Balance Methods for Frequency-Domain Analog-Circuit Analysis. IEEE Transactions on Computer-Aided Design of Integrated Circuits and Systems. vol. 26, Issue: 12, pp. 2089-2101, 2007.

Bhat, Harish S., and Braxton Osting. "Two-Dimensional Inductor-Capacitor Lattice Synthesis." Sep. 19, 2011.

Eldar, Lior, and Peter Shor. "A Discrete Fourier Transform on Lattices with Quantum Applications." arXiv preprint arXiv:1703.02515 (2017).

Bhat, Harish S., and Braxton Osting. "Two-Dimensional Inductor-Capacitor Lattice Synthesis." Oct. 2011.

Osgood, Brad. "The Fourier transform and its applications." Lecture notes for EE 261. 2014.

Li Ying Chi, "Fourier Transform in Non-linear circuit simulation", Sep. 22, 2009.

"High-Performance DSP Capability Within an Optimized Low-Cost FPGA Architecture", A Lattice Semiconductor White Paper, Jun. 2004.

Afshari, Ehsan, Harish S. Bhat, and Ali Hajimiri. "Ultrafast analog Fourier transform using 2-D LC lattice." IEEE Transactions on Circuits and Systems I: Regular Papers 55.8 (2008): 2332-2343.

Da Cunha Brito, Leonardo, and Paulo Henrique Portela de Carvalho. "Simulation of RF Analog Circuits: A Systematic Exposition of the Harmonic Balance and Complex Envelope Methods." Journal of Communication and Information Systems 19.1 (2004).

* cited by examiner

REDUCED RESOURCE HARMONIC BALANCE CIRCUIT SIMULATIONS

BACKGROUND

Circuit simulation is a critical aspect in the modern circuit design process. The design process is a highly interactive operation wherein the designer uses the simulator to explore the circuit. It is important that the iterative exploration process of circuit design be as efficient and as natural as possible. Some circuits, such as a network of resistors, act as a linear system and can be simulated using conventional approaches. Other circuits, such as an RF and microwave circuits, do not act as linear systems and are comparatively difficult to simulate due to their non-linear nature. One method devised to simulate circuits with non-linear components is harmonic balance analysis.

Historically, harmonic balance analysis was a mixed analysis technique that works by dividing a circuit that contains both linear and non-linear components into two subnetworks: a linear subnetwork that contains the linear circuit components and a non-linear subnetwork that contains the non-linear circuit components. The two subnetworks may be connected by one or more ports, e.g. $P_1$, $P_2$, $P_N$, that correspond to the number of non-linear components. The linear subnetwork may then be solved using a frequency domain approach, while the non-linear subnetwork may be solved using a time-domain approach. After initial results for the two subnetworks are determined, the results are combined over multiple error reducing iterations. Another conventional approach is shown in FIG. 3 and discussed in detail below. While these conventional approaches may yield more accurate results than previous methods, they still have several drawbacks.

For instance, the accuracy of harmonic balance analysis is often dependent on the number of harmonics required to accurately model the non-linear components in the system. In circuits with highly non-linear components, the number of harmonics required can be significantly large. The large number of harmonics required to accurately simulate the circuit can cause problems with the noise floor, convergence (e.g. the ability to reach a steady state result), and processor/memory usage. For instance, in a circuit with one or more local oscillators (LO) and frequency divider pairs, conventional harmonic balance approaches have difficulty converging the total system to the steady state result because these circuits are extremely nonlinear and difficulty to represent in a Fourier-series basis. In some cases, the system never converges and a result cannot be generated.

These issues are further compounded in multicarrier RF systems, such as LTE; where as the number of carriers increases, the number of independent frequencies (sometimes called "tones") in the harmonic balance analysis also increased. Thus the amount of data that must be processed and stored for a single simulation can easily reach many terabytes. Further, given the large amounts of data that must be processed, the time required to output accurate results for multicarrier analysis often exceeds practical limitations.

As is evident, there is a need for an approach to simulate circuits with non-linear components, such as those found in multicarrier systems, in a way that maintains accuracy while reducing processing and memory consumption to practical levels.

DESCRIPTION OF THE DRAWINGS

The drawings illustrate the design and utility of some embodiments of the present invention. It should be noted that the figures are not drawn to scale and that elements of similar structures or functions are represented by like reference numerals throughout the figures. In order to better appreciate how to obtain the above-recited and other advantages and objects of various embodiments of the invention, a more detailed description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

Figure 1:
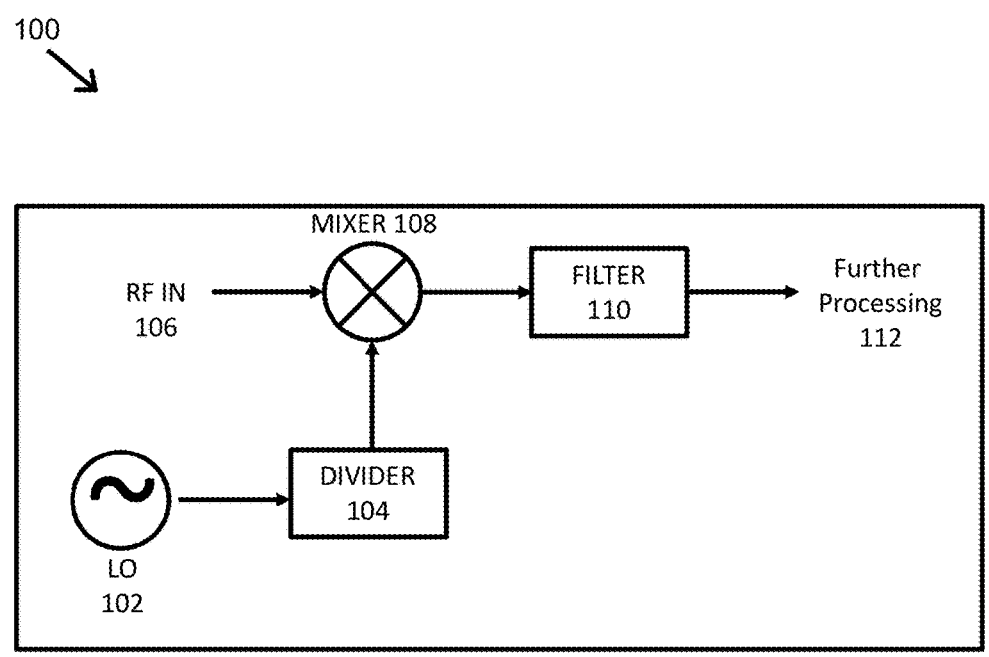
FIG. 1 illustrates a single carrier circuit with non-linear components in which reduced resource harmonic balance simulations may be implemented.

Various embodiments of the invention are directed to a method, system, and computer program product for reduced resource harmonic balance circuit simulations. Other objects, features, and advantages of the invention are described in the detailed description, figures, and claims.

Various embodiments of the methods, systems, and articles of manufacture will now be described in detail with reference to the drawings, which are provided as illustrative examples of the invention so as to enable those skilled in the art to practice the invention. Notably, the figures and the examples below are not meant to limit the scope of the present invention. Where certain elements of the present invention can be partially or fully implemented using known components (or methods or processes), only those portions of such known components (or methods or processes) that are necessary for an understanding of the present invention will be described, and the detailed descriptions of other portions of such known components (or methods or processes) will be omitted so as not to obscure the invention.

Further, the present invention encompasses present and future known equivalents to the components referred to herein by way of illustration.

Before describing the examples illustratively depicted in the several figures, a general introduction is provided to further understanding.

In some embodiments, reduced resource harmonic balance circuit simulations may begin by setting initial parameters for a circuit with non-linear components and generating frequency domain results. The frequency domain results may then be input into a transform module, which may implement a transform integral based at least in part on lattices such as an Inverse Lattice Fourier Transform, to obtain time domain results. The time domain results may then be analyzed to determine time-domain quantities needed to compute residuals of the Kirchhoff's equations, such as by analyzing the circuit components for currents and charges. The residuals may then be input in lattice form into a second transform module, which may implement a second transform integral based at least in part on lattices such as the Lattice Fourier Transform, to generate frequency-based results (e.g. corresponding to the frequency domain) on a frequency cut dataset. In some embodiments, the frequency cut dataset corresponds to a sparse frequency cut (e.g. wide funnel cut, cross-box cut), where generally some intermodulation products have been removed, reduced, or modified. In some embodiments, the frequency cut dataset and lattices used in the based transform modules have been configured as initial parameters such that they match. In some embodiments, the frequency cut dataset and the lattice points align with one another and can be treated as corresponding to the same base-lattice.

In some embodiments, once the residuals are produced in the frequency domain, a determination may be performed to determine whether Kirchoff's Laws are satisfied. If they are satisfied (e.g. balanced to a desired accuracy), the process may terminate and simulation results may be output for analysis. If Kirchoff's Laws are not satisfied (e.g. imbalanced), then new initial parameters designed to reduce the imbalance may be input into the simulation sequence to generate new (e.g. modified) frequency result data. The process of inputting new values, evaluating residuals, and determining whether Kirchoff's Laws are balanced may be repeated, iterated, or looped until the system converges upon a satisfactory steady state result, as according to some embodiments.

FIG. 1 illustrates an example single carrier circuit with non-linear components. As illustrated in this example, a local oscillator (LO) 102 may produce a sinusoidal voltage signal at one or more frequencies. A frequency divider 104 may then divide the signal, which may then be mixed with an RF signal 106 through a mixer 108. The output of the mixer 108 may then be filtered using a filter 110 to reduce/remove unwanted features, or modify the signal as required per implementation. Once filtered, the signal may be output for further processing 112.

The circuit illustrated in FIG. 1 may be characterized as "non-linear" with respect to voltage and current. Generally, linear components (e.g. resistors) vary current and voltage linearly. That is, for example, for every change in voltage there is a linear change in current. Linear components are typically easier to simulate because they may be solved using conventional time domain techniques, such as solving Kirchoff's Laws in the time-domain. However, non-linear components, such as a power amplifier, do not vary their voltage and current linearly. Circuits with non-linear components are typically more difficult to simulate due to the number of waveforms (e.g. harmonics) that must be processed in order to accurately model the signal and balance Kirchoff's Laws to produce an output.

Figure 2:
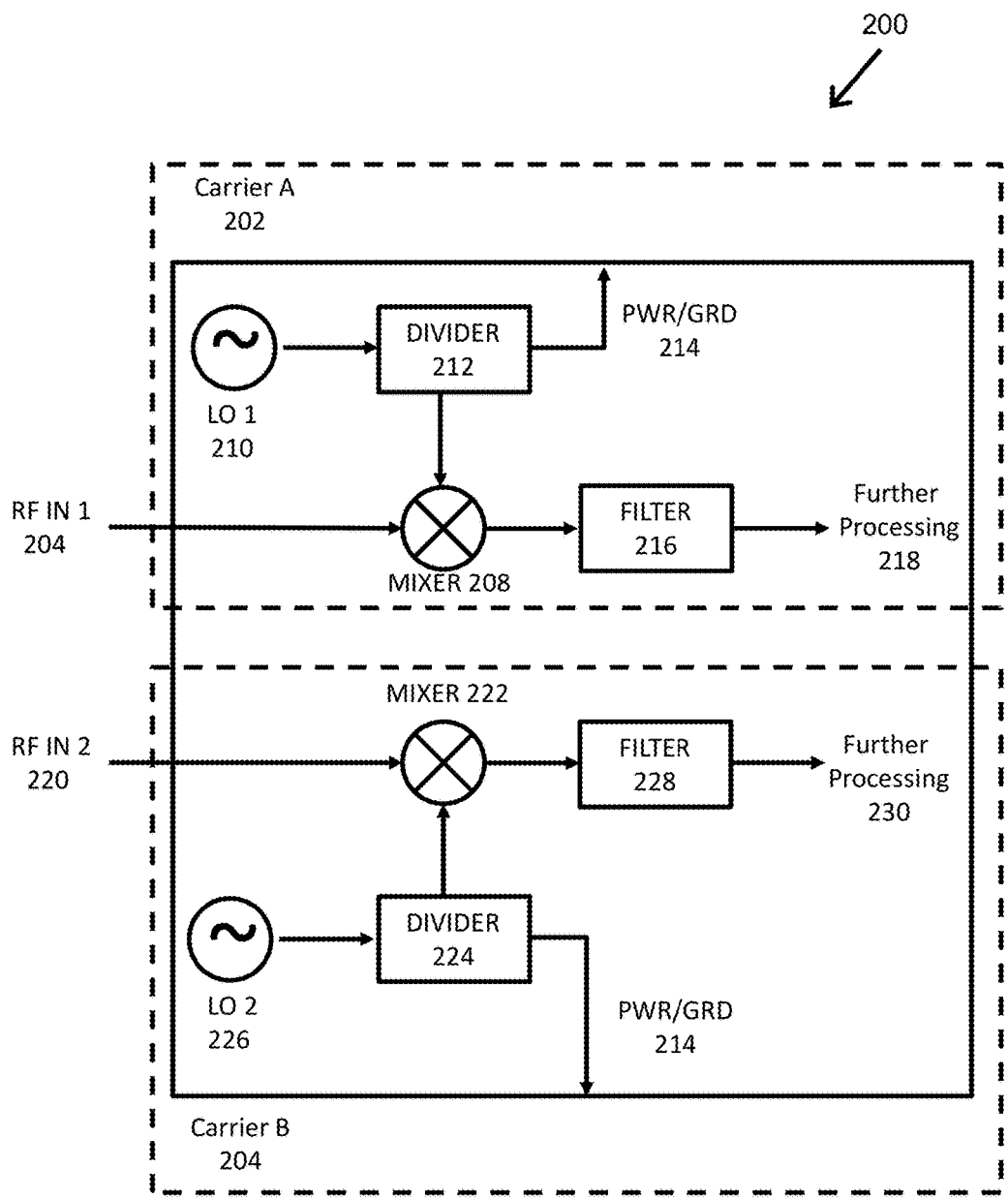
FIG. 2 illustrates a multicarrier circuit with non-linear components in which reduced resource harmonic balance simulations may be implemented.

FIG. 2 illustrates an example multicarrier circuit with non-linear components. Multicarrier RF designs are becoming more commonplace because the carrier aggregation enables an increase in overall bandwidth. The multicarrier circuit 200 comprises two carrier signal subcircuits: carrier A subcircuit 202, which may process a signal at first frequency, and carrier B subcircuit 204, which may process a different signal at a second frequency (different than the first frequency). In modern implementations, such as in chips found in modern "smartphones", the subcircuits may be implemented on the same chip and share resources, e.g. the same power and/or ground 214. It is necessary to analyze various performance aspects (distortion, compression, sensitivity, etc.) of the circuits that relate to the simultaneous existence and operation of the multiple carriers. For example because one or more carrier signals are implemented on the same chip and/or sharing the same resources (e.g. power/ground 214) there may be cross talk between the local oscillators (e.g. 210, 204) or other components, which may lead to unwanted signals being generated in the receive bands of one or the other subcircuits. Thus, it can be beneficial to simulate multicarrier circuits to analyze how they respond to different parameters and extract results (e.g. parasitics) for analysis.

Figure 3:
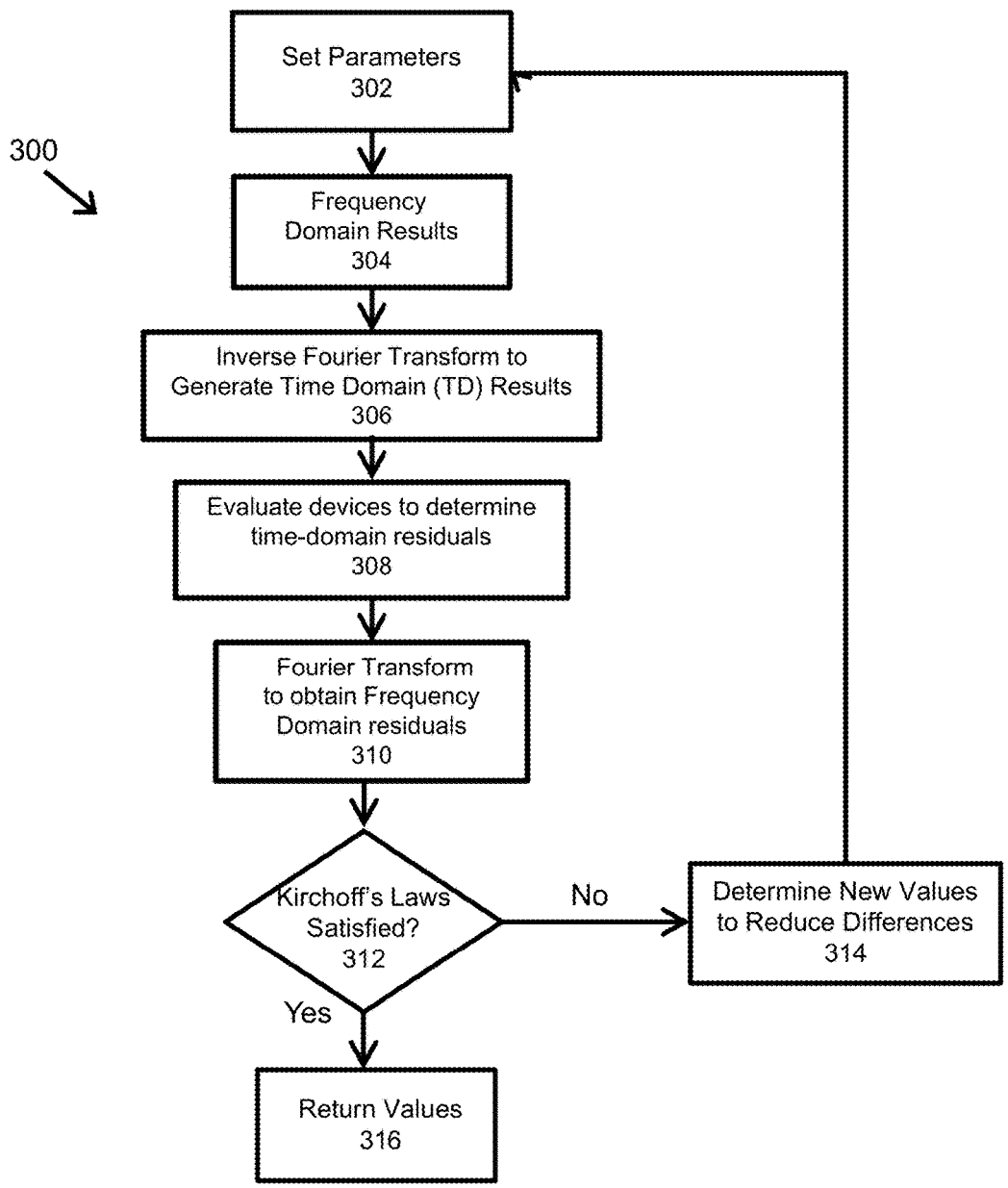
FIG. 3 shows a flowchart for an approach for harmonic balance simulations.

FIG. 3 shows a flowchart 300 for an approach for harmonic balance circuit simulations. At 302, initial parameters, such as the desired frequency range, desired accuracy, and an initial guess as to what are the correct voltage values, are selected. At 304, the currents for the linear devices are solved according to Kirchoff's Laws to generate frequency domain results. At 306, the frequency domain results are input into a first transform module, which may implement the Inverse Fourier Transform, to generate time domain results. At 308, the time domain results may be analyzed to determine the time-domain residuals, such as the current/charges on the non-linear devices in the circuit. At 310, the time domain residuals are input into a second transform module, which may implement the Fourier Transform, to generate the frequency domain residuals. At 312, there may be a determination of whether Kirchoff's Laws are satisfied using the frequency domain residuals. If Kirchoff's Laws are satisfied or balanced to the desired accuracy, the values are output or otherwise returned at 316 for analysis and further processing. If Kirchoff's Laws are not satisfied or imbalanced, then at 314 new values for the initial voltages may be selected in a way to reduce the imbalance (e.g. if the results are too high/low, as indicated by the imbalance analysis at 312, then the initial voltages at 302 may be reduced or increased accordingly). From 314, the process may be repeated or looped over numerous times with newer selected values that are designed to reduce the imbalance in Kirchoff's Laws until the system converges on a result with the desired accuracy.

One issue with the harmonic balance process is that the amount of data first generated at 304 and processed throughout the steps can be enormous. For example, to accurately simulate a multicarrier circuit, such as the one illustrated in FIG. 2, numerous harmonics must be processed, which can yield terabytes of data points to keep track of, and/or process in the remaining operations (e.g. 306-316). Some approaches devised for the harmonic balance process implement diamond and/or box frequency cuts. However, as discussed below in further detail, the diamond and box frequency cut approaches still require enormous amounts of data to be processed back and forth between the time and frequency domains. Thus, such approaches are generally not efficient for most practical multicarrier simulation purposes because they still require large amounts of limited computational resources, such as memory, processing power, and time to process the enormous amounts of data.

Figure 4A:
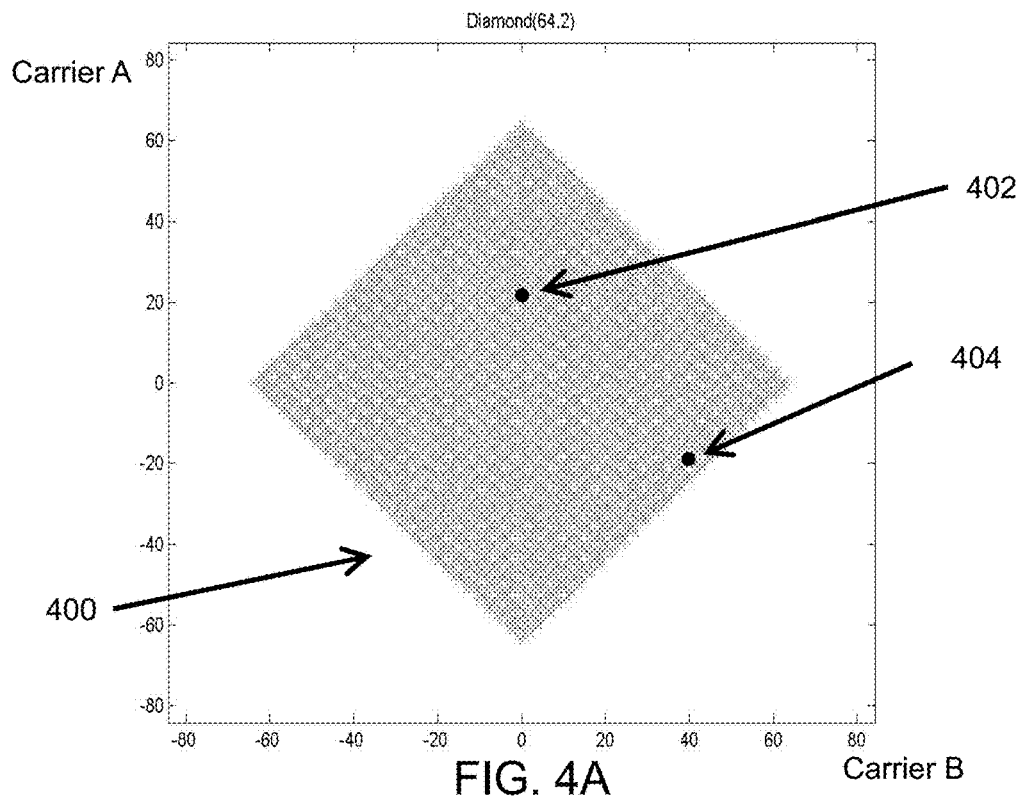
FIG. 4A-B illustrate diamond and box frequency cut datasets.

FIG. 4A illustrates an example of a diamond frequency cut 400. There, the x-axis may correspond to the carrier B frequencies in kHz (e.g. LO 226 generated frequencies, FIG. 2), and the y-axis may correspond to the carrier A frequencies in kHz (e.g. LO 210 generated frequencies, FIG. 2). The diamond shaped object 400 in FIG. 4A are the linear combinations (e.g. harmonics) of the carrier A frequencies and carrier B frequencies, which may be used as calculation (e.g. sample) points. Thus, for example, frequency point 402 may correspond to "20 kHz carrier A signal+0 kHz carrier B signal". Similarly, frequency point 404 is a linear combination (e.g. intermodulation) of the two frequencies that corresponds to "−20 kHz carrier A signal+40 kHz carrier B signal".

Figure 4B:
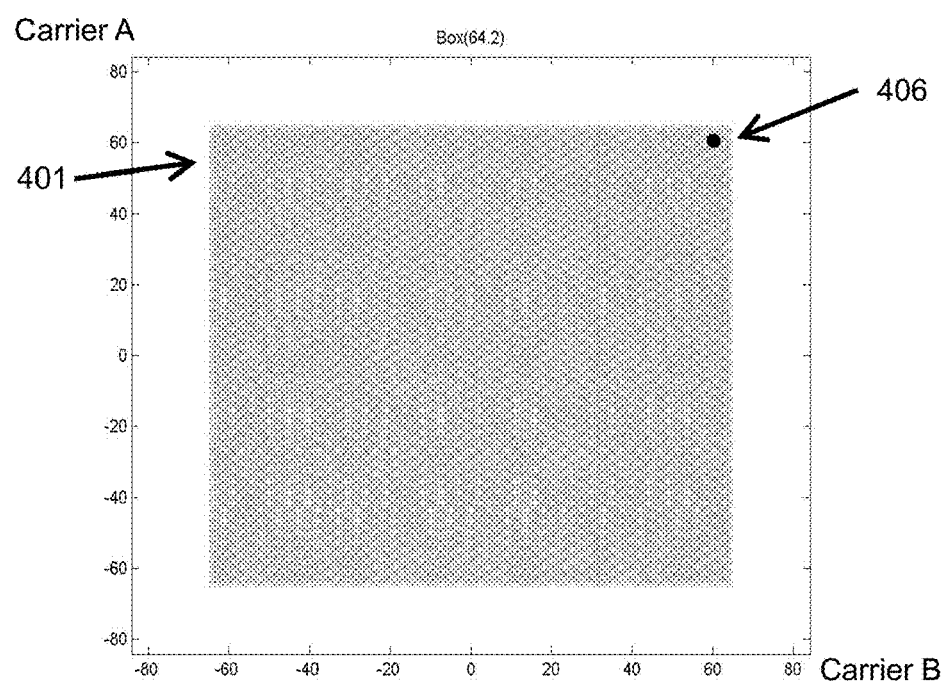

An alternative "box" frequency cut 401 is illustrated in FIG. 4B. Comparing FIG. 4A and FIG. 4B, it is evident that the box frequency cut 401 covers more intermodulation frequencies than the diamond frequency cut 400. For instance, frequency point 406, which corresponds to "60 kHz carrier A signal+60 kHz carrier B signal" is covered by the corner of the box cut in FIG. 4B and thus will be included in the harmonic balance operation if the box frequency cut dataset is implemented. However, frequency point 406 is not covered by the diamond cut in FIG. 4A; thus, the point will not be included in the harmonic balance operation if the diamond cut is used instead of the box cut.

Accordingly, because the box frequency cut 401 contains more frequency points, it may be more accurate for circuits that have significant energies in the higher order harmonics (e.g. frequency point 406). However, the accuracy comes at a cost: because the box cut contains more frequency points, it will require more memory and more processing resources to model the additional points. In contrast, the diamond frequency cut 400 trims the higher orders and may thus be faster and less expensive to compute. Additionally, in many circuits using the diamond cut and the box cut will yield similar simulation results because many circuits do not have energies in the higher intermodulated orders.

Figure 5:
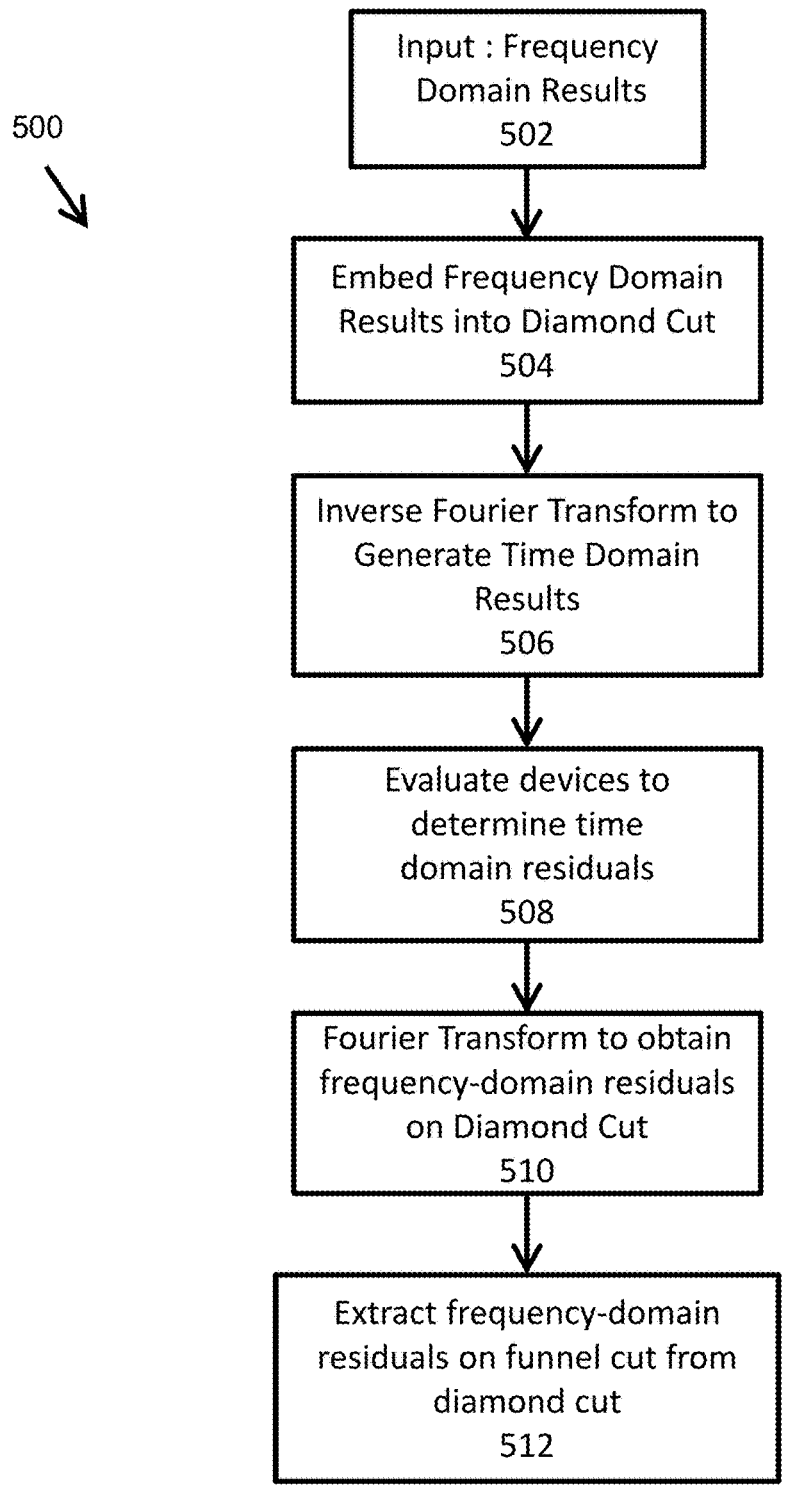
FIG. 5 shows a flowchart for an approach for harmonic balance simulations that uses a diamond frequency cut dataset

FIG. 5 shows a flowchart for an approach 500 for reducing the amount of data processed in a harmonic balance operation. There, the process starts with the frequency domain results at 502 (i.e. 502 corresponds to 304 in FIG. 3). These frequency domain results are presumed to lie on a sparse frequency cut such as the funnel cut. In order to perform the Fourier Transforms, once the data that corresponds to the frequency domain results is determined at 502, the data may be embedded into a diamond frequency cut at 504. As illustrated in FIG. 4A, the diamond frequency cut is a type of frequency cut dataset that corresponds to the various possible harmonics of the one or more carrier signals.

At 506, the diamond frequency cut data may then be input into a transform module, which may implement the Inverse Fourier Transform, to generate the time domain results. At 508, the residuals, which may correspond to current/charges of the circuit components, may be determined by evaluating the non-linear devices in the circuit being simulated. At 510, residuals data is embedded on a diamond cut (e.g. diamond frequency cut dataset 400) and input into a second transform module, which may implement the Fourier Transform, to generate the frequency domain residuals. At 512, the data may be further reduced by extracting funnel cut points (e.g. FIG. 9A) from the diamond cut data.

While the use of the funnel cut approach shown in FIG. 5 may result in a reduction of overall data and computational expense. While it still requires use of the diamond cut to evaluate the Fourier Transform and evaluate quantities in the time domain, the speed and memory reduction is fairly limited since the diamond cut still requires allocating an enormous amount of memory. For example, for a multicarrier circuit simulation, the diamond frequency cut dataset may still require terabytes of data to be processed. Thus at 506 and 510 (in FIG. 5) enormous sets of data in the form of a diamond frequency cut must still be processed back and forth between the domains. Still worse, many simulations loop over multiple iterations to converge (see 314, FIG. 3) upon a steady state result. Thus, the computational expensive processes of transferring the diamond cut data between domains (e.g. 506, 510) is magnified as circuit complexity increases. For example, if simulating modern multicarrier circuits, such as those used in LTE, the amount of data processed using the diamond frequency cut may exceed practical computational resources.

Figure 6A:
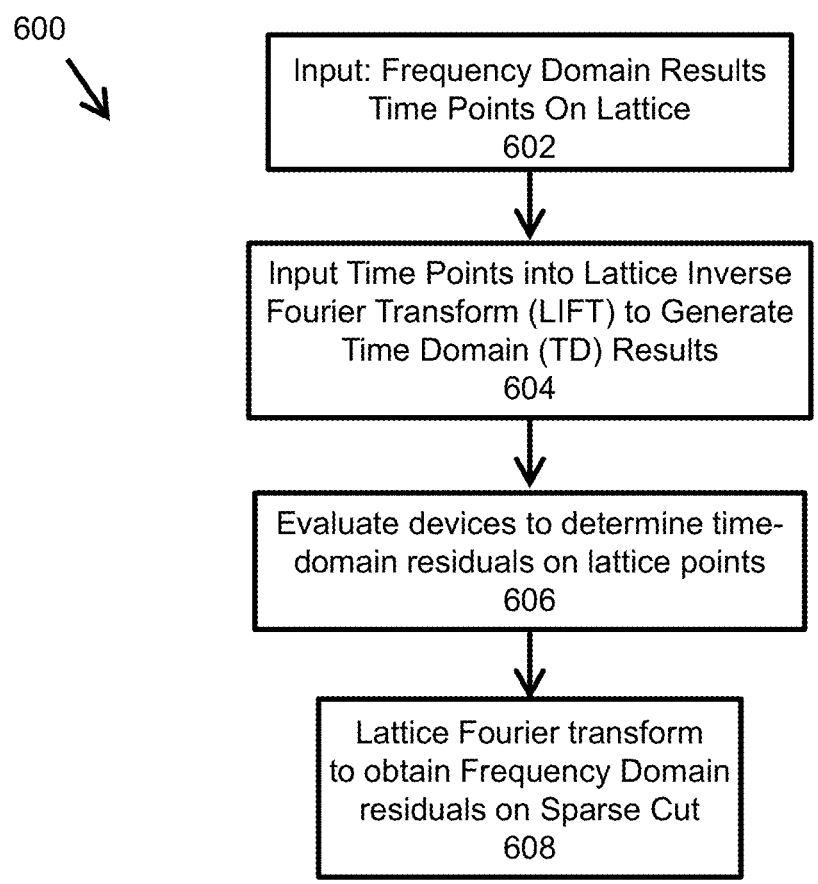
FIG. 6A shows a flowchart for an approach for reduced resource harmonic balance simulations using lattice structures and sparse frequency cut datasets, as according to some embodiments.

FIG. 6A shows a flowchart 600 for an approach using lattices and sparse frequency cut datasets to reduce the amount of computational resources required by a very large factor. At 602, the frequency domain results (e.g. frequency result data) are generated using conventional simulation approaches. The frequency result data may serve as an input for the lattice based transform process. Generally, a lattice is an n-dimensional set of points that, in some embodiments, are linear combinations of a basis set of generating vectors. For instance, in an example lattice of size M, "y" may be the generating vector in $Z^d$, Z may be the generating vector in $R^d$, such that z corresponds to z=y/M. Further, in this example, for all x, x=(1/M) jy mod M, j=0, . . . , M−1.

An index matrix corresponding to the frequency cut (discussed in further detail below) may be represented as the matrix "H", where, in some embodiments, the rows of the matrix correspond to a d-dimensional vector for a harmonic index in frequency space. That is, the rows of H may be treated, as the frequency indices in the sparse cut. For example, for a box cut with maximum harmonics equal to "1" (e.g. maxharms=1), in two dimensional space (e.g. d=2), the matrix may have nine rows that correspond to frequency indices: {{−1, −1}, {−1, 0}, {−1, 1}, {0, −1}, {0, 0}, {0, 1}, {1, −1}, {1, 0}, {1, 1}} (in list/array notation). Further, in some embodiments, a lattice may be considered valid or congruent with the harmonic balance approaches discussed below if, in terms of the matrix H, the condition mod(H*y, M) results in unique indices (e.g. unique rows in the vector).

Figure 6B:
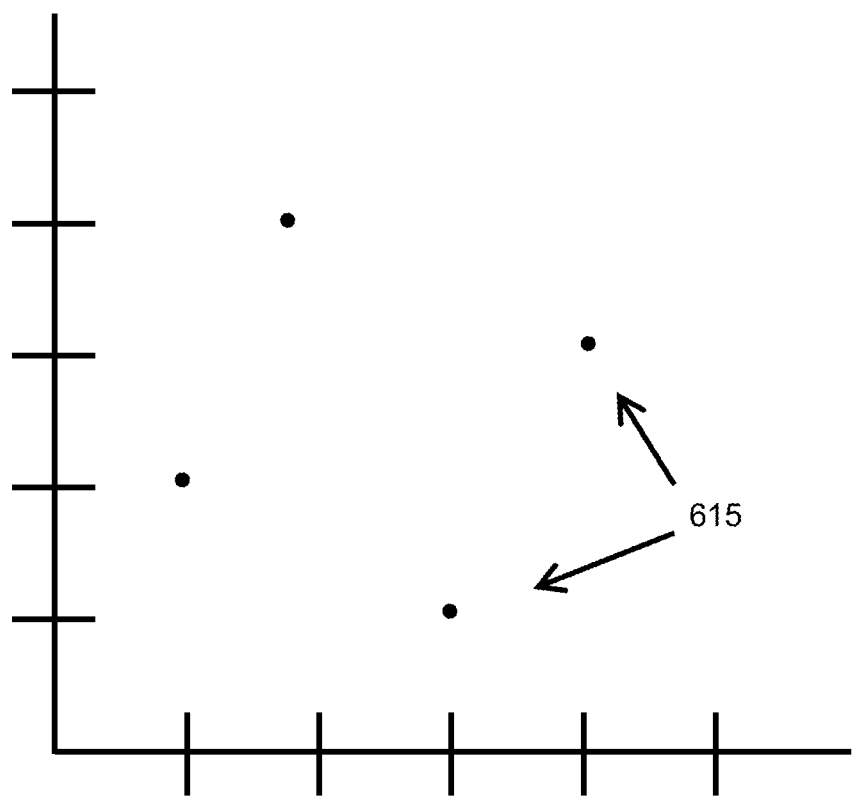
FIG. 6B shows an example lattice structure.

FIG. 6B shows an example of a lattice. The points of the lattice 615 may act as quadrature nodes (e.g. sample points in the time domain). In harmonic balance terminology, the lattice points may be used to get the phases for sources and also may be used to compute the transforms (e.g. Fourier Transform, Inverse Fourier Transform, FFT). In particular, utilizing a lattice allows a multi-dimensional FFT result, such as:

$$f(x_j) = \sum_{k \in H} \hat{f}_k e^{2\pi i (k^T x_j)}$$

$$f(x_j) = \sum_{k \in H} \hat{f}_k e^{2\pi i (jk^T z)}$$

-continued $$f(x_j) = \sum_{k \in H} \hat{f}_k e^{2\pi i (jk^T y/M)}$$

to be mapped to a one-dimensional Inverse Lattice Fourier Transform (e.g. Inverse-FFT-based):

$$f(x_j) = \sum_{l=0}^{M-1} g_l e^{2\pi i j l/M}$$

where, $$g_l = \sum_{k \in H, k^T y \bmod M = l} \hat{f}_k$$

That is, $g_l$ is the sum over all frequency indices, k, such that $k^T y = l$ (modulo M). Thus, instead of computing multiple FFTs to generate frequency data over multiple dimensions, a rank-1 lattice may be computed in one transform module instead.

The Lattice Fourier Transform may be determined by writing the Inverse Lattice Fourier Transform in matrix notation, T; where T is a matrix of M rows, the number of columns in T equals the number of rows of H, and the non-zero entries of T are all ones (e.g. "1"). In particular, this may be computed via the procedure involving a forward FFT:

$$g(j) = \sum_{l=0}^{M-1} f_l e^{-2\pi i j l/M}$$

followed by a copy operation from the lattice mapping frequency indices:

for $j=1$ to $N$, $\hat{f}(j) = g(k(j))$ where $k(j) = \mod(H_{y,j}, M)$

Referring to FIG. 6A, at 604, the frequency result data may then be input into a first transform module, which may implement a Inverse Lattice Fourier Transform, to generate lattice time data that corresponds to the time domain. At 606, the lattice time data may be used to determine the time-based residual data (e.g. current/charges) for the non-linear devices of the circuit. The time based residual data may then be input into a second transform module, which may implement the Lattice Fourier Transform, to generate the frequency-based residuals data (e.g. residuals data that corresponds to the frequency domain) on a frequency cut data set, such as as a sparse frequency cut dataset (see FIG. 9A, discussed below). The frequency cut dataset may then be used to evaluate whether Kirchoff's Laws are balanced to the desired accuracy. As explained, the process may iterate until the desired accuracy is achieved.

In some embodiments, the sparse frequency cut may correspond to the lattice. In some cases, more than one lattice matches the sparse frequency cut and can be used to generate a valid transform result (e.g. FFT result). That is, given a specific sparse frequency cut, a plurality of lattice values (e.g. y, M) may define a lattice that matches the sparse frequency cut. In some embodiments, a sparse cut is selected, which may dictate the quadrature node spacing of the lattice to be computed. In some embodiments, a sparse cut is selected and a search is conducted for lattices with lattice values (e.g. y, M) that yield a valid transform result (e.g. FFT). In some embodiments, the smallest lattice (e.g. smallest M) that works with a given sparse cut is selected to reduce computational workload.

Figure 7:
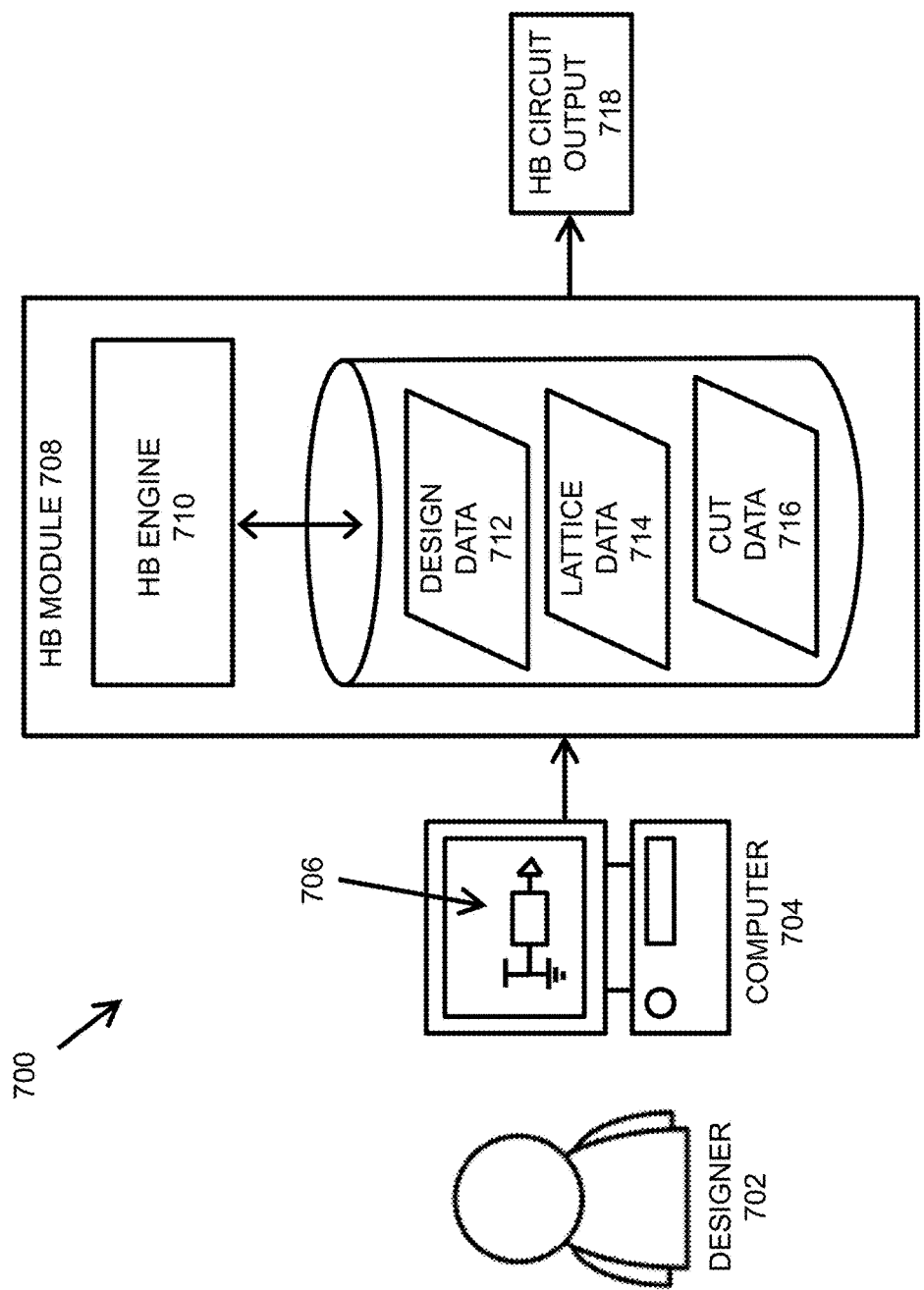
FIG. 7 illustrates an example system and architecture for implementing reduced resource harmonic balance circuit simulations, as according to some embodiments.

FIG. 7 illustrates an example system and architecture 700 for performing reduced resource harmonic balance circuit simulations, as according to some embodiments. There, a designer 702 may interface with a computer device 704 to simulate a circuit with non-linear components 706. The computer device 704 may correspond and/or comprise components as illustrated in FIG. 10, such as a processor 1407, memory 1408, and a storage device 1410. Referring to FIG. 7, the computer device 704 may comprise or interface with a harmonic balance module 708. The harmonic balance module 708 may comprise a harmonic balance engine 710 to perform the processes shown in FIG. 6 and FIG. 8 (discussed below). In some embodiments, the harmonic balance engine 710 may comprise one or more transform modules that implements transformations on the simulation data (e.g. frequency results data, residuals data) located in memory using the Lattice Fourier Transform, the Inverse Lattice Fourier Transform, discrete transform schemes (e.g. FFT), or other transform schemes as are known in the art that may be modified to work with lattices, such as the Laplace Transform. In some embodiments, the simulation data corresponds to specialized data structures, such as lattices, lattice structures, or frequency cut datasets, in computer memory (e.g. 1408; or 714, 716 discussed below) that may be processed or transformed by one or more transform modules in the harmonic balance engine 710.

The harmonic balance module 708 may also comprise design data 714, which may correspond to the circuit 706 that is being simulated; lattice data 714 which may correspond to lattice structure and parameters; and cut data 716, which may correspond to sparse frequency cut dataset. In some embodiments, the harmonic balance engine 710 uses the design data 712, lattice data 714, and cut data 716 in the approaches described in FIG. 6 and FIG. 8 to output circuit results 718. Notably, the approach shown in FIG. 7, using lattice and sparse cuts, can simulate a circuit with non-linear components without exceeding the practical limitations of the computer device 704 (e.g. processor 1407, memory 1408, and a storage device 1410) because the lattice data 714 and the frequency cut data 716 allow for a large reduction in the amount data points processed.

Figure 8:
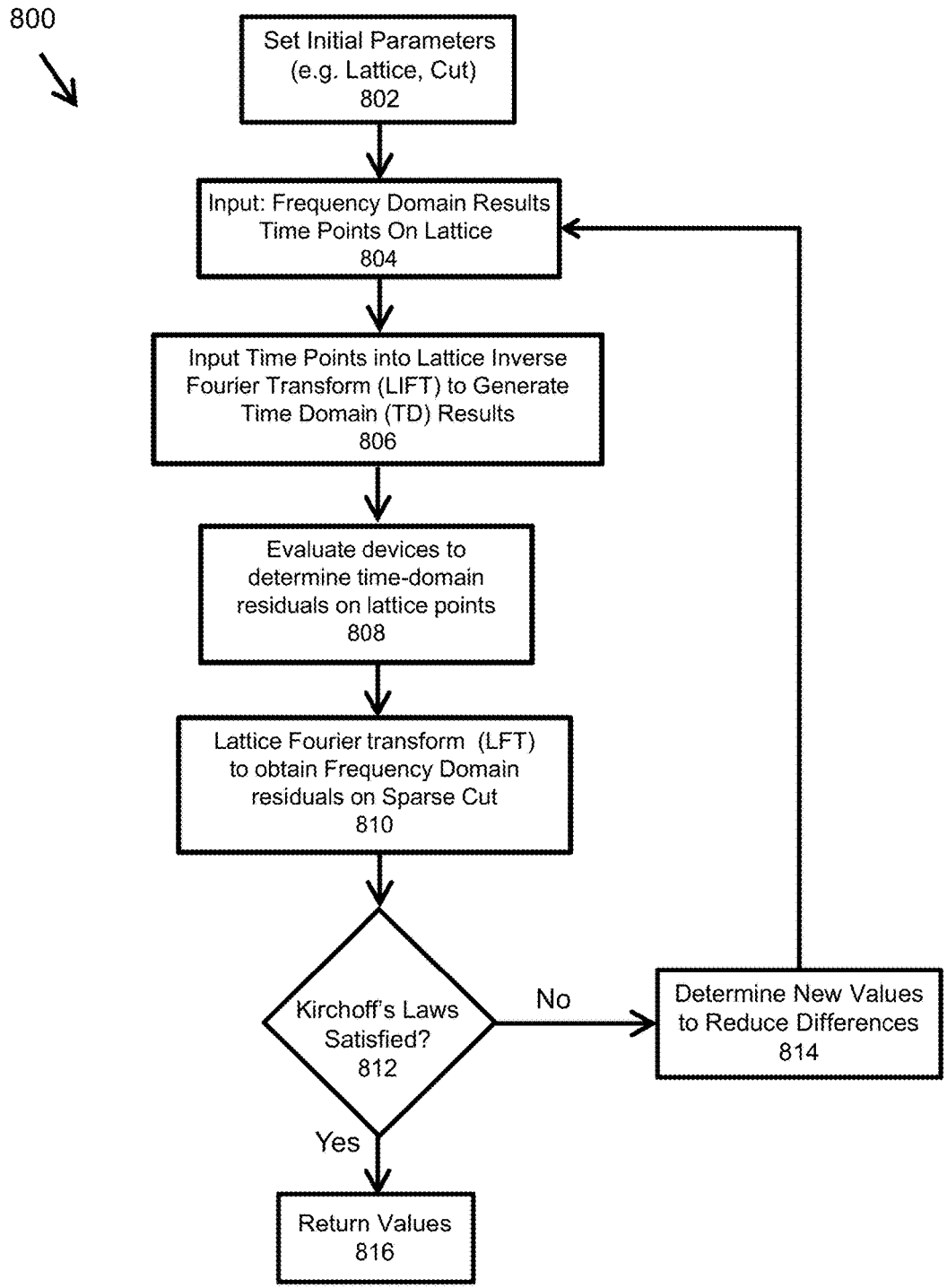
FIG. 8 shows a flowchart for an approach for reduced resource harmonic balance simulations using lattice structures and sparse frequency cut datasets in an iterative process, as according to some embodiments.

FIG. 8 shows a flowchart 800 for an approach for a reduced resource harmonic balance simulation that incorporates lattices and sparse frequency cuts, as according to some embodiments. At 802, initial parameters, such as the desired frequency range, desired accuracy, an initial guess as to what the correct voltage values are, the frequency cut, and the lattice structure, are selected. At 804, frequency domain results are generated. At 806, the frequency result data is input into a first transform module to generate corresponding lattice time data, where the first transform module may implement the Inverse Lattice Fourier Transform. In some embodiments, the Inverse Lattice Fourier Transform implemented at 806 uses the parameters set at 802 (e.g. lattice values). At 808, time domain residuals are determined by evaluating the lattice time data to determine current/charges for the non-linear devices to generate time-based residual data. At 810, the time-based residual data (e.g. residuals data that corresponds to the time domain) may be input into a second transform module, which may implement the Lattice Fourier Transform, to generate frequency data on a sparse frequency cut dataset (e.g. sparse cuts, see FIG. 9A-E). At 812, there is a determination whether Kirchoff's Laws are satisfied based at least in part on the frequency cut dataset. If Kirchoff's Laws are satisfied or balanced to a desired accuracy, the values are returned at 816. However, if Kirchoff's Laws are not satisfied or imbalanced with respect to a desired accuracy threshold, at 814 new values are generated to generate new frequency result data. The process may then be looped or iterated until the desired accuracy (e.g. steady state result) is achieved. Notably, the approach illustrated in FIG. 8 avoids using the diamond/box cuts (see 404, 410, FIG. 4), thus avoiding processing potentially large amounts of data back and forth between the time domain and frequency domain, over numerous iterations. Accordingly, by implementing a sparse cut and lattice at 802, the system 700 (FIG. 7) can perform harmonic balance simulations with large reductions in the processing power, time, and memory required.

Figure 9A:
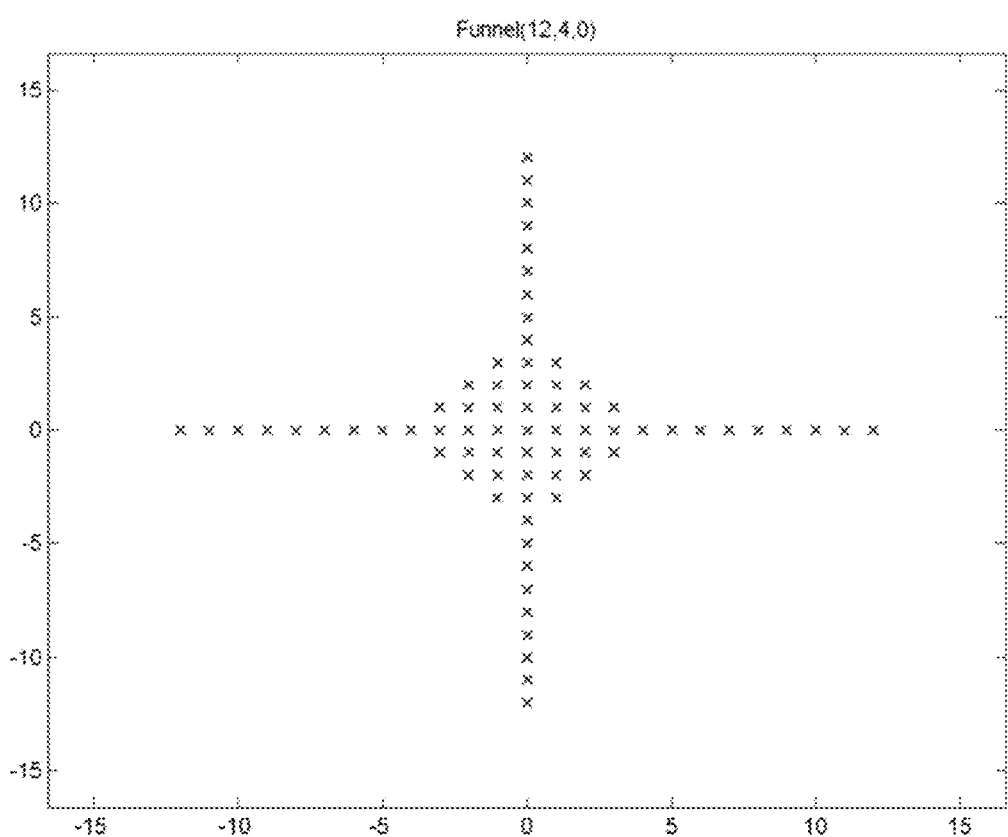
FIG. 9A-E illustrate example sparse frequency cut datasets, as according to some embodiments.
Figure 9B:
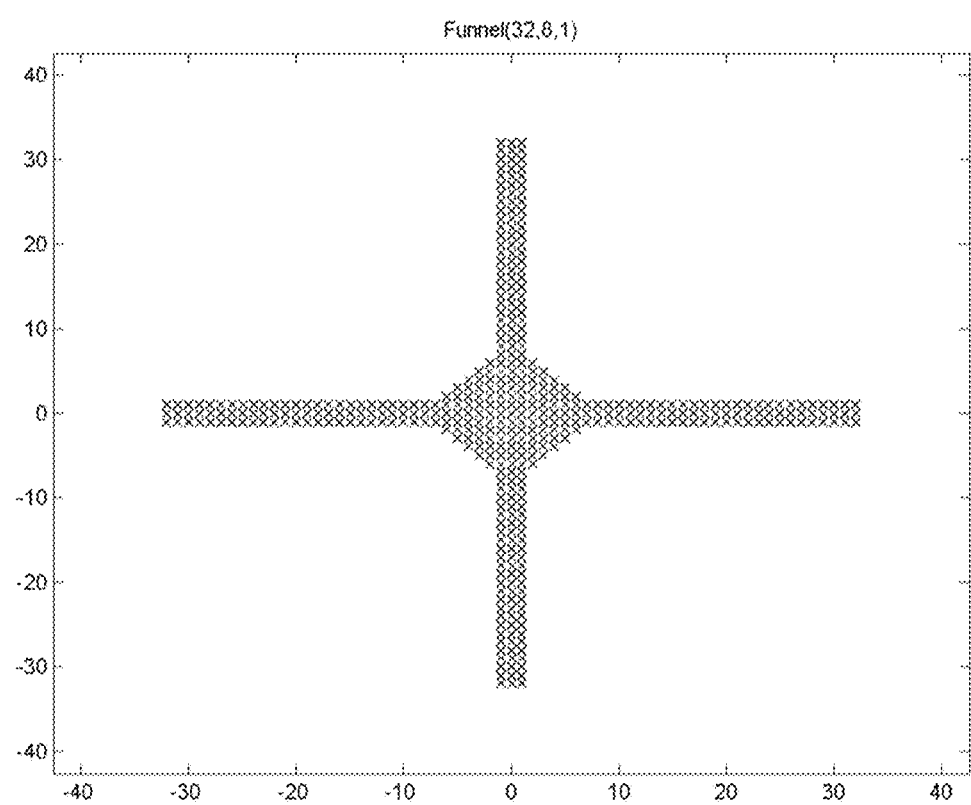
Figure 9C:
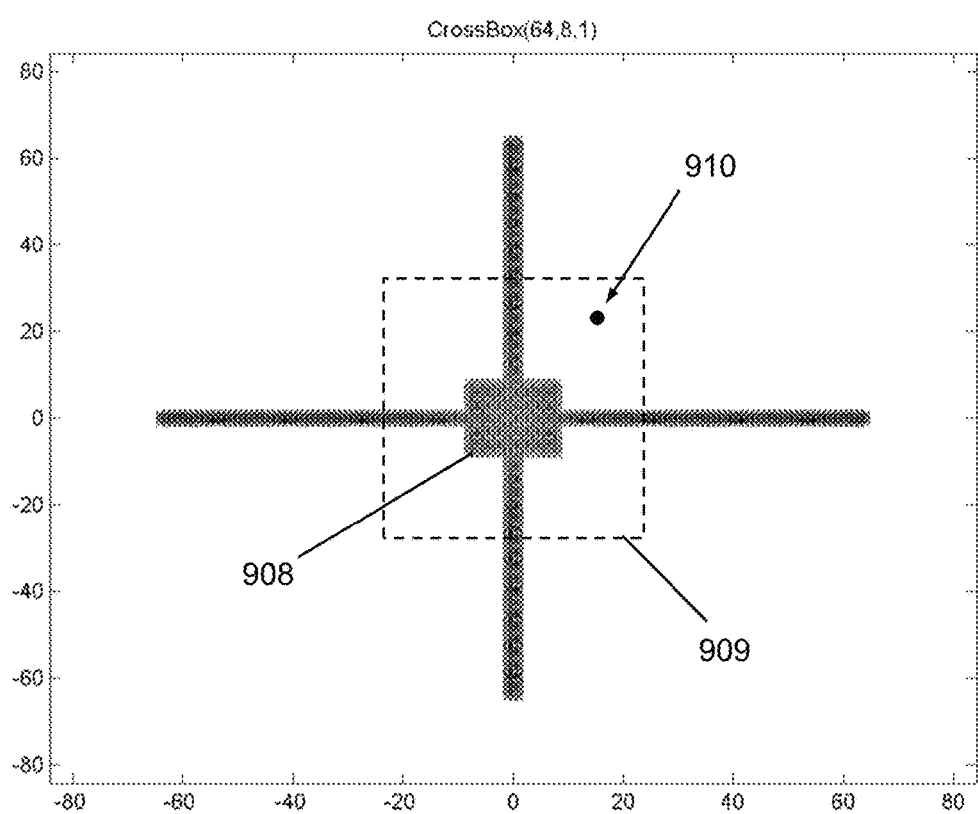
Figure 9D:
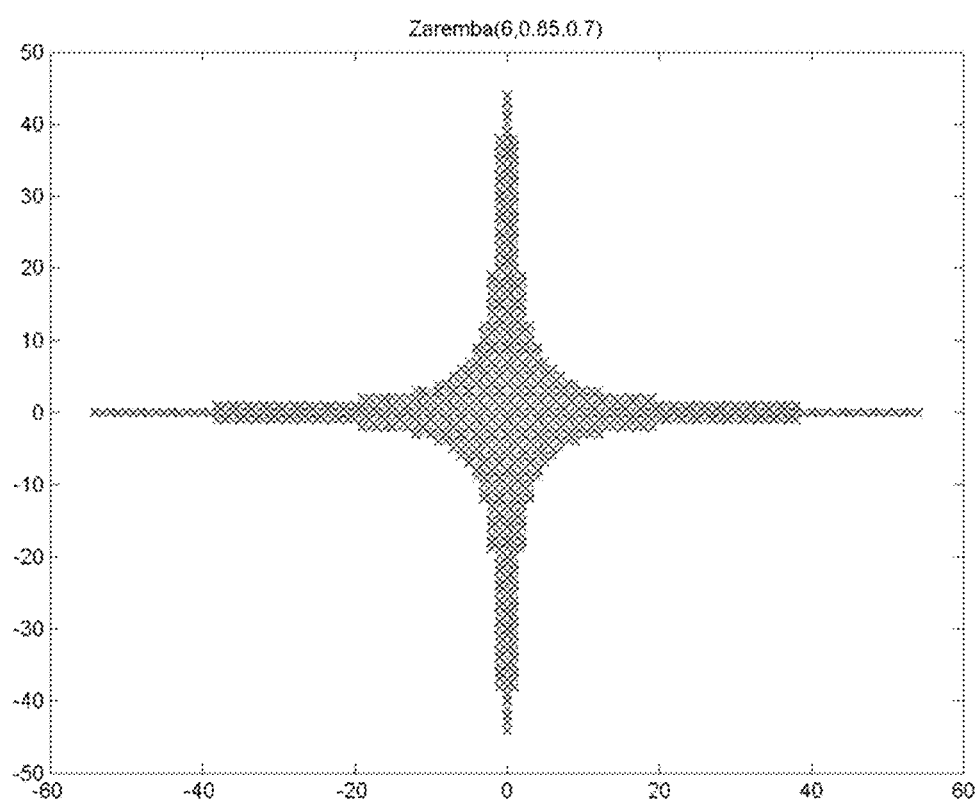
Figure 9E:
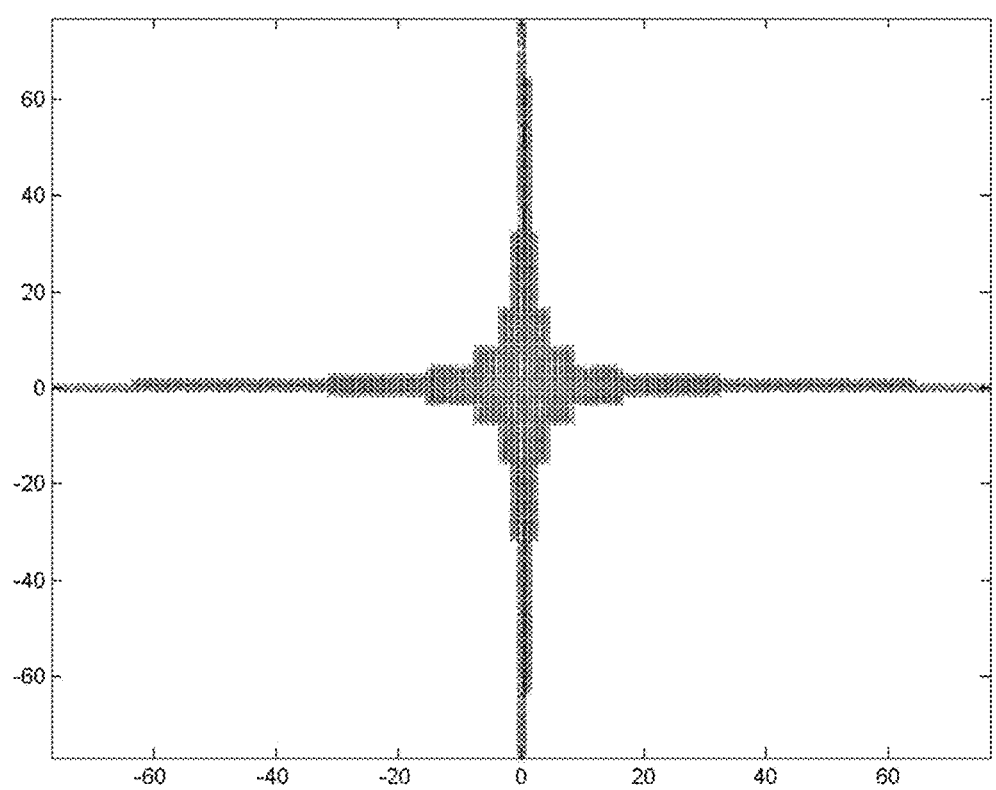

FIG. 9A-E illustrate various sparse frequency cuts that may be selected at the initial parameter setting stage 802, according to some embodiments. FIG. 9A illustrates a funnel cut. Each "x" in the funnel is a sample or quadrature point that may be used in the harmonic balancing process. As explained, in some embodiments, the sparse cut points (e.g. the x's in the funnel cut) correspond to a lattice with lattice values (y, M) that match the sparse cut. In this way, the lattice can be used for the balancing process (e.g. 804-816, in FIG. 8) and the sparse frequency cut data can simply be extracted from the lattice because the lattice and the sparse cut match. FIG. 9B illustrates a wide funnel sparse frequency cut dataset. FIG. 9C illustrates a cross-box sparse frequency cut dataset. FIG. 9D illustrates a "Zaremba" sparse frequency cut dataset (e.g. a Zaremba cut). FIG. 9E illustrates a hyperbolic cross point sparse frequency cut dataset (e.g. a hyperbolic cross-point cut). Each cut illustrated is merely as an example, and one of ordinary skill in the art appreciates that by using the lattice approaches above, one my construct or tailor a lattice to match the non-linear (e.g. RF, microwave) circuit being simulated using the harmonic balance process. For example, if a given circuit exhibits significant energies at an intermodulated point 910 (FIG. 9C), then the small center box 908 may be enlarged to a large center box 909 to cover more intermodulation points. In this case, as according to some embodiments, a new lattice may then be constructed as necessary to match the modified/enlarged box 909, so that the circuit can be evaluated using the reduced resource harmonic balance simulation approaches (e.g. FIG. 8).

As mentioned, in some circuit simulations the sparse cuts may trim the intermodulation points where the intermodulation frequency energies may be negligible. However in some circuits, the intermodulation points can have significant energy values. In these cases ignoring the intermodulation points with significant energies can yield numerical errors. For example, FIG. 9A illustrates a funnel cut where the "stems" of the funnel extend from −12 to 12 along the x and y axis. The intermodulation points are calculated from −4 to 4 along the x and y axis, as well as the linear combinations of those points. If an intermodulation point with significant energy lies outside the funnel cut points, then it may be disregarded, which may cause errors in result or output of the harmonic balance simulation process.

Figure 10A:
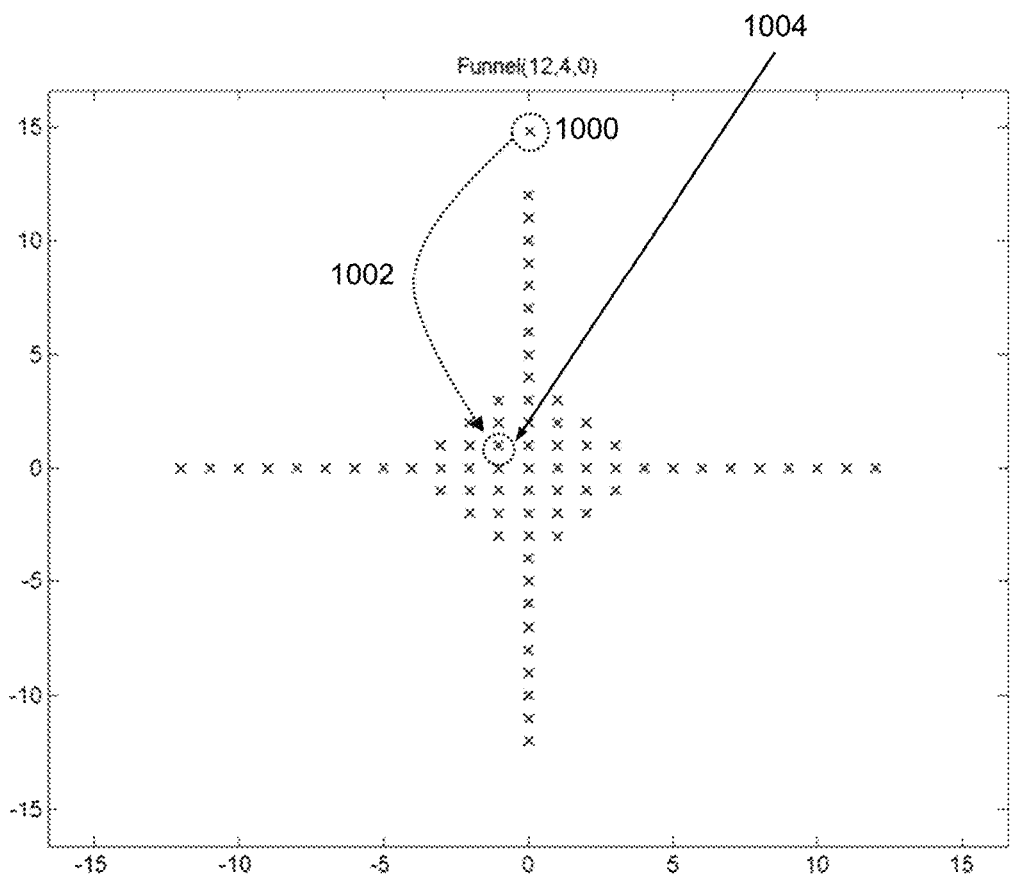
FIG. 10A-B illustrate example frequency point aliasing, as according to some embodiments.

FIG. 10A illustrates an approach for aliasing disregarded frequency points. There, as an example, frequency point 1000 lies at 15 on the y-axis frequency and 0 on the x-axis frequency, e.g. (0, 15). As explained, the funnel stem only extends to 12 and thus, as applied, frequency point 1000 will be disregarded. If frequency point 1000 has a significant energy or power level, then disregarding it may result in errors. To avoid errors, frequency point 1000 may be aliased (as represented by arrow 1002) to another point, such as frequency point 1004, at (−1, −1) so that frequency point 1000 may be included in the analysis.

However, aliasing points to other points can also result in errors. For instance, suppose frequency point 1000 has a power of −50 dBc, which in many implementations may be considered a relatively low power. However, if frequency point 1004 (and/or the frequency points around frequency points 1004) are of interest (e.g. under close examination), and frequency point 1004 has a power of −100 dBc, then aliasing (e.g. mapping, moving) frequency point 1000 to frequency point 1004 may swamp the signal. This is because −50 dBc, while small, is orders of magnitude larger than −100 dBc. If frequency point 1004 was a critical point of interest this would represent an unacceptable loss of simulation accuracy.

To avoid this result, as according to some embodiments, an anti-aliasing condition can be implemented to alias points to "safe" locations. The condition may ensure that the modulus of the lattice values (e.g. y, M) of the points considered do not match one another. That is, the condition is met if: mod(H*ys, M) is not equal to mod(H*ya, M), where "ys" are the indices for the sensitive frequency combination (e.g. frequency point 1004) and "ya" are the indices for the aggressive frequency combination (e.g. frequency point 1000).

Figure 10B:
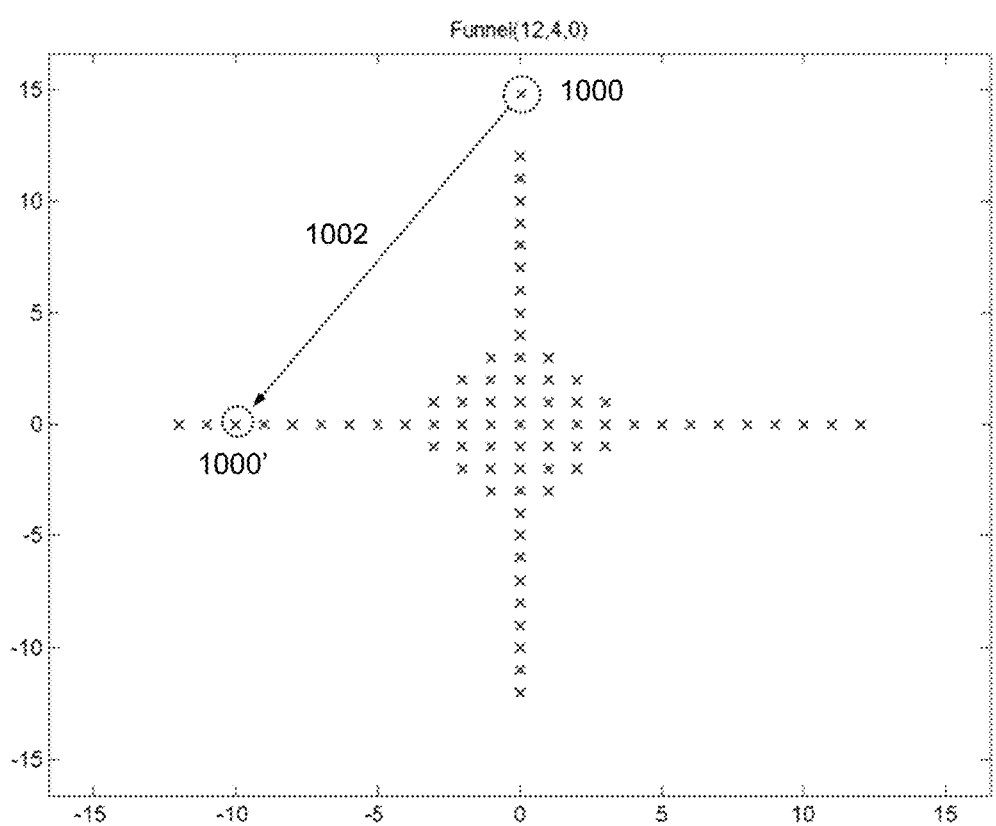

FIG. 10B illustrates a safe aliasing procedure as implemented with the anti-aliasing condition, as according to some embodiments. There, frequency point 1000 and the point at (−10, 0) meet the above anti-aliasing condition, thus aliasing may occur. For instance, in some embodiments, the point at (−10, 0) may have a similar energy as that of frequency point 1000. Thus, frequency point 1000 may be safely aliased 1002 to (−10, 0), where it may be included in the harmonic balance analysis as aliased frequency point 1000'. In this way, harmonics with large power levels will not be mapped into sensitive locations (e.g. frequency areas, frequency points) that are under close examination, or are otherwise important for the simulation output.

Though specific frequency points are discussed above, one of ordinary skill in the art appreciates that what frequencies are considered "safe" and what power levels and/or errors are considered acceptable may vary per circuit or implementation. For example, in one implementation the difference between the power levels −50 dBc and −100 dBc may generate unacceptable errors, while in that same implementation −50 dBc and −70 dBc may be acceptable (as indicated by an error threshold or otherwise). Still in other implementations, −50 dBc and −70 dBc may produce unacceptable error levels. Thus, the error thresholds, frequency cuts, frequencies, lattice values, and/or other parameters can be modified or optimized per implementation.

Therefore, what has been disclosed is a novel approach for reduced resource harmonic balance circuit simulations using lattice structures and sparse frequency cut datasets. The invention provides numerous advantages such as a significant reduction in the amount of data processed in the harmonic balance iterative operation. Further, because the amount of data processed is reduced, the amount of time required to process the data is likewise reduced by a significant amount. An additional advantage includes the ability to customize the sparse frequency cut per circuit being simulated by simply adjusting the frequency data points being sampled and the corresponding lattice structure.

Figure 11:
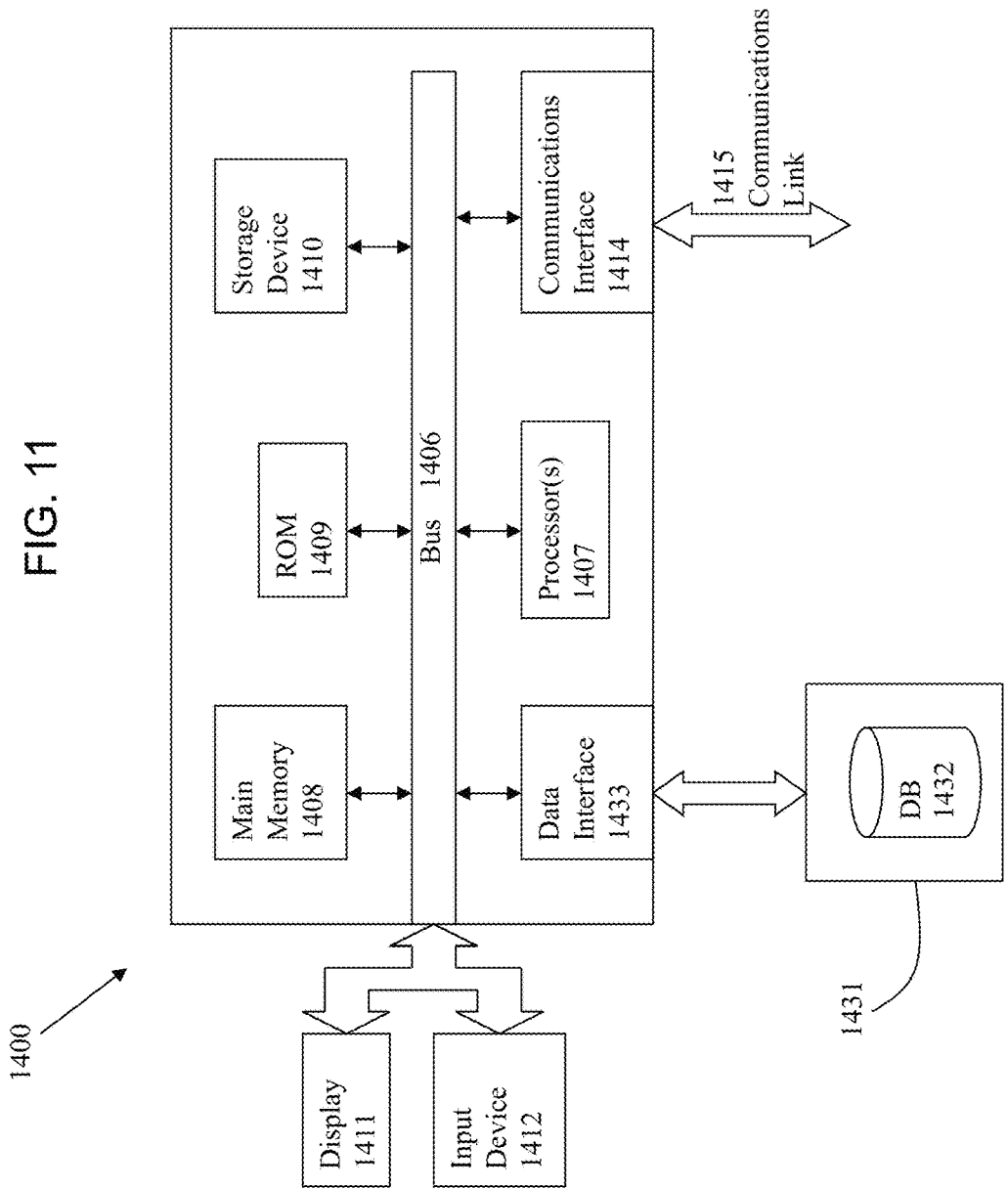
FIG. 11 illustrates example system architecture.

FIG. 11 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control.

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A computer implemented method for implementing an electronic circuit comprising one or more non-linear devices with harmonic balance techniques, comprising:
    identifying, at a harmonic balance module functioning in conjunction with at least one microprocessor of and stored at least partially in memory of a computing system, a sparse frequency cut process;
    determining, at the harmonic balance module, a reduced size for a lattice that corresponds to a quadrature node spacing, the quadrature node spacing determined based at least in part upon the sparse frequency cut process and a criterion for reducing computational workload in harmonic balance analyses of the electronic circuit;
    determining, at the harmonic balance module, a first transform from a frequency domain to a time domain and a second transform from the time domain to the frequency domain based at least in part upon the reduced size of the lattice, the first transform having a reduced dimensionality;
    generating frequency domain data in the frequency domain for reducing imbalance in behaviors of the electronic circuit at least by performing one or more harmonic balance analyses with reduced data and reduced computational resource utilization while avoiding executions of multiple transforms over multiple dimensions having a dimensionality higher than the reduced dimensionality of the first transform, performing one or more harmonic balance circuit analyses with reduced data and reduced computational resource utilization comprising:
        generating, at the harmonic balance module, frequency result data that corresponds to the frequency domain while removing at least some intermodulation points in the electronic design;
        generating lattice time data in the time domain at least by transforming the frequency result data with the first transform;
        generating time-based residual data from the lattice time data of the lattice of the electronic design; and
        generating frequency-based residual data that corresponds to a frequency cut dataset using at least the second transform and at least some of the time-based residual data; and
    interactively implementing the electronic design of the electronic circuit at least by reducing imbalance in behaviors of the electronic design with the frequency-based residual data and the one or more harmonic balance analyses based at least in part upon the frequency-based residual data, while avoiding the executions of the multiple transforms over multiple dimensions having the dimensionality higher than the reduced dimensionality.

2. The computer implemented method of claim 1, further comprising:
    determining whether Kirchhoff's Laws are imbalanced in one or more harmonic balance analyses based at least in part on the frequency cut dataset.

3. The computer implemented method of claim 2, further comprising:
    determining new values to generate new frequency result data if Kirchhoff's Laws are imbalanced, wherein the new values are designed to reduce the imbalance.

4. The computer implemented method of claim 1, wherein the frequency cut dataset corresponds to the lattice.

5. The computer implemented method of claim 4, wherein the lattice corresponds to lattice values configured to match the frequency cut dataset.

6. The computer implemented method of claim 4, further comprising generating the frequency cut dataset using at least one of a funnel cut, a wide funnel cut, a cross-box cut, a zaremba cut, or a hyperbolic cross-point cut.

7. The computer implemented method of claim 1, further comprising:
generating the time-based residual data by evaluating one or more circuit components.

8. The computer implemented method of claim 1, wherein the first transform module implements an Inverse Fourier Transform, and the second transform module implements a Fourier Transform.

9. A system for implementing an electronic circuit comprising one or more non-linear devices with harmonic balance circuit techniques, comprising:
at least one processor of a computing system; and
memory storing thereupon a sequence of instructions which, when executed by the at least one processor of the computing system, causes the at least one processor to:
identify, at a harmonic balance module functioning in conjunction with at least one microprocessor of and stored at least partially in memory of a computing system, a sparse frequency cut process;
determine, at the harmonic balance module, a reduced size for a lattice that corresponds to a quadrature node spacing, the quadrature node spacing determined based at least in part upon the sparse frequency cut process and a criterion for reducing computational workload in harmonic balance analyses of the electronic circuit;
determine, at the harmonic balance module, a first transform from a frequency domain to a time domain and a second transform from the time domain to the frequency domain based at least in part upon the reduced size of the lattice, the first transform having a reduced dimensionality;
generate frequency domain data in the frequency domain for reducing imbalance in behaviors of the electronic circuit at least by performing one or more harmonic balance analyses with reduced data and reduced computational resource utilization while avoiding executions of multiple transforms over multiple dimensions having a dimensionality higher than the reduced dimensionality of the first transform, performing one or more harmonic balance circuit analyses with reduced data and reduced computational resource utilization comprising:
generate, at the harmonic balance module, frequency result data that corresponds to the frequency domain while removing at least some intermodulation points in the electronic design;
generate lattice time data in the time domain at least by transforming the frequency result data with the first transform;
generate time-based residual data from the lattice time data of the lattice of the electronic design; and
generate frequency-based residual data that corresponds to a frequency cut dataset using at least the second transform and at least some of the time-based residual data; and
interactively implement the electronic design of the electronic circuit at least by reducing imbalance in behaviors of the electronic design with the frequency-based residual data and the one or more harmonic balance analyses based at least in part upon the frequency-based residual data while avoiding the executions of the multiple transforms over multiple dimensions having the dimensionality higher than the reduced dimensionality.

10. The system of claim 9, further comprising:
determining whether Kirchhoff's Laws are imbalanced in one or more harmonic balance analyses based at least in part on the frequency cut dataset.

11. The system of claim 10, further comprising:
determining new values to generate new frequency result data when the Kirchhoff's Laws are imbalanced in the one or more harmonic balance analyses, wherein the new values are designed to reduce imbalance in the one or more harmonic balance analyses.

12. The system of claim 9, wherein the frequency cut dataset corresponds to the lattice.

13. The system of claim 12, wherein the lattice corresponds to lattice values configured to match the frequency cut dataset.

14. The system of claim 12, further comprising generating the frequency cut dataset using at least one of a funnel cut, a wide funnel cut, a cross-box cut, a zaremba cut, or a hyperbolic cross-point cut.

15. The system of claim 9, further comprising:
generating the time-based residual data by evaluating one or more circuit components.

16. The system of claim 9, wherein the first transform module implements a Fourier Transform and the second transform module implements an Inverse Fourier Transform.

17. A computer program product embodied on a non-transitory computer usable medium, the non-transitory computer readable medium having stored thereon a sequence of instructions which, when executed by a processor causes the processor to execute a method for implementing an electronic circuit comprising one or more non-linear devices with harmonic balance techniques, the method comprising:
identifying, at a harmonic balance module functioning in conjunction with at least one microprocessor of and stored at least partially in memory of a computing system, a sparse frequency cut process;
determining, at the harmonic balance module, a reduced size for a lattice that corresponds to a quadrature node spacing, the quadrature node spacing determined based at least in part upon the sparse frequency cut process;
determining, at the harmonic balance module, a first transform from a frequency domain to a time domain and a second transform from the time domain to the frequency domain based at least in part upon the reduced size of the lattice, the first transform having a reduced dimensionality;
generating frequency domain data in the frequency domain for reducing imbalance in behaviors of the electronic circuit at least by performing one or more harmonic balance circuit analyses with reduced data and reduced computational resource utilization while avoiding executions of multiple transforms over multiple dimensions having a dimensionality higher than the reduced dimensionality of the first transform, performing one or more harmonic balance circuit analyses with reduced data and reduced computational resource utilization comprising:
generating, at the harmonic balance module, frequency result data that corresponds to the frequency domain while removing at least some intermodulation points in the electronic design;

generating lattice time data in the time domain at least by transforming the frequency result data with the first transform;

generating time-based residual data from the lattice time data of the lattice of the electronic design having a quadrature node spacing for the electronic circuit; and generating frequency-based residual data that corresponds to a frequency cut dataset using at least the second transform and at least some of the time-based residual data; and interactively implementing the electronic design of the electronic circuit at least by exploring the electronic design with one or more harmonic balance analyses based at least in part upon the frequency-based residual data while avoiding the executions of the multiple transforms over multiple dimensions having the dimensionality higher than the reduced dimensionality.

18. The computer program product of claim 17, wherein the frequency cut dataset corresponds to the lattice, and the lattice corresponds to lattice values configured to match the frequency cut dataset.

19. The computer program product of claim 17, further comprising generating the frequency cut dataset using at least one of a funnel cut, a wide funnel cut, a cross-box cut, a zaremba cut, or a hyperbolic cross-point cut.

20. The computer program product of claim 17, wherein the first transform module implements a Fourier Transform, and the second transform module implements an Inverse Fourier Transform.

* * * * *